United States Patent
Kobayashi

(10) Patent No.: US 8,142,985 B2
(45) Date of Patent: Mar. 27, 2012

(54) METHOD FOR MANUFACTURING SEMICONDUCTOR DEVICE

(75) Inventor: Katsutoshi Kobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 421 days.

(21) Appl. No.: 12/477,719

(22) Filed: Jun. 3, 2009

(65) Prior Publication Data

US 2009/0305169 A1    Dec. 10, 2009

(30) Foreign Application Priority Data

Jun. 4, 2008   (JP) ................. 2008-146591

(51) Int. Cl.
G03F 7/26   (2006.01)
(52) U.S. Cl. .................... 430/311; 430/325; 430/330
(58) Field of Classification Search .................. 430/311, 430/325, 330
See application file for complete search history.

(56) References Cited

U.S. PATENT DOCUMENTS

2006/0194155 A1 *  8/2006  Kawamura et al. ........... 430/394
2007/0003879 A1 *  1/2007  Chang et al. .................. 430/311

FOREIGN PATENT DOCUMENTS

| JP | 2006-235230 | 9/2006 |
|---|---|---|
| JP | 2007-013162 | 1/2007 |
| JP | 2007-142181 | 6/2007 |
| JP | 2008-098520 | 4/2008 |

* cited by examiner

Primary Examiner — Kathleen Duda
(74) Attorney, Agent, or Firm — Finnegan, Henderson, Farabow, Garrett & Dunner, L.L.P.

(57) ABSTRACT

A method for manufacturing a semiconductor device including: forming a resist film 11 on a film to be processed 32; baking the resist film 11; performing immersion exposure on the resist film 11 after the baking; performing post exposure bake on the resist film 11 after performing the immersion exposure; developing the resist film 11 after performing the post exposure bake; and after the post exposure bake is performed on the resist film 11, removing an edge 15 of the resist film 11, the edge not being exposed.

7 Claims, 8 Drawing Sheets

(a)

(b)

(a)

(b)

METHOD FOR MANUFACTURING SEMICONDUCTOR DEVICE

CROSS REFERENCE TO RELATED APPLICATION

This application is based upon and claims the benefit of priority from the prior Japanese Patent Application No. 2008-146591 filed on Jun. 4, 2008 in Japan, the entire contents of which are incorporated herein by reference.

BACKGROUND OF THE INVENTION

1. Field of the Invention

The present invention relates to a method for manufacturing a semiconductor device.

2. Related Art

Generally, a method for manufacturing a semiconductor element includes many processes such as a process to deposit a plurality of materials on a silicon wafer as a film to be processed and a process to form a desired pattern on the film to be processed. Hereinafter, the process to form a pattern on the film to be processed will be explained. First, a resist film is formed by coating the surface of the film to be processed with a photosensitive material which is generally called a resist. Next, a predetermined region of the resist film is exposed. Next, the exposed region or an unexposed region of the resist film is removed in a development process to form a resist pattern. Further, dry etching is performed on the film to be processed by using the resist pattern as an etching mask. In this way, the pattern is formed on the film to be processed.

In recent years, with the miniaturization of patterns, immersion lithography capable of achieving a high NA (numerical aperture) has been used. In the immersion lithography, immersion exposure is performed by providing an immersion liquid (for example, pure water) between an exposure lens and the surface of the resist film. Further, in the immersion lithography, the immersion exposure is performed on a predetermined region by scanning the surface of the resist film with the exposure lens and the immersion liquid, which is called scanning exposure. Since the resist film contacts with the immersion liquid, a resist film (topcoatless resist film) for the immersion lithography process is developed to perform the scan with the exposure lens and the immersion liquid at high speed.

After the immersion exposure is performed, the edge of the resist film (namely, a peripheral region of the resist film formed on the surface of the wafer) remains the unexposed region. When a positive type resist is used, there is a case where the unexposed region is not removed to be left in the development process. Accordingly, wafer edge exposure (WEE) and the immersion exposure are performed on the edge of the resist film in the above order before the edge of the resist film is removed in the development process (see JP-A 2006-235230 (Kokai), for example).

However, when the wafer edge exposure is performed before the immersion exposure as in the conventional way, there is a problem that the edge of the resist film has a different film quality from the other regions of the resist film during the immersion exposure.

SUMMARY OF THE INVENTION

According to one aspect of the embodiments of the present invention, there is provided a method for manufacturing a semiconductor device including: forming a resist film on a film to be processed; baking the resist film; performing immersion exposure on the resist film after the baking; performing post exposure bake on the resist film after performing the immersion exposure; developing the resist film after performing the post exposure bake; and after the post exposure bake is performed on the resist film, removing an edge of the resist film, the edge not being exposed.

According to another aspect of the embodiments of the present invention, there is provided a method for manufacturing a semiconductor device including: forming a resist film on a film to be processed; baking the resist film; performing immersion exposure on the resist film after the baking; performing post exposure bake on the resist film after performing the immersion exposure; performing wafer edge exposure on an edge of the resist film after performing the post exposure bake; heating the edge of the resist film simultaneously or after performing the wafer edge exposure on the edge of the resist film; and developing the resist film after the edge of the resist film is heated.

According to a still another aspect of the embodiments of the present invention, there is provided a method for manufacturing a semiconductor device including: forming a resist film on a film to be processed; baking the resist film; performing immersion exposure on the resist film after the baking; performing wafer edge exposure on an edge of the resist film after performing the immersion exposure; performing post exposure bake on the resist film after performing the wafer edge exposure; developing the resist film after performing the post exposure bake; and cooling the resist film after performing the immersion exposure on the resist film and before performing the post exposure bake on the resist film.

DETAILED DESCRIPTION OF THE INVENTION

Before explaining the embodiments of the present invention, how the inventor achieved the present invention will be explained. Hereinafter, the resist film in the present specification represents a resist film (topcoatless resist film) for the immersion lithography process.

The inventor uniquely discovered, as explained in the Related Art section, that when the wafer edge exposure is performed before the immersion exposure, the edge of the resist film is changed in its film quality to have a different film quality from the other regions of the resist film during the immersion exposure. Therefore, the inventor uniquely discovered that when the immersion exposure using the scanning exposure method is performed on the resist film having the edge whose film quality is changed, leakage of the immersion liquid occurs due to the edge of the resist film. Specifically, the inventor discovered that when the immersion exposure is performed by scanning the resist film with the exposure lens with the immersion liquid provided between the resist film and the exposure lens, the liquid leaks through the edge of the resist film to flow around the wafer. Further, the inventor uniquely discovered that when the leakage of the immersion liquid occurs, the leaked liquid changes the temperature of the wafer, which causes focus deviation, for example, to negatively affect the immersion exposure.

Figure 1:
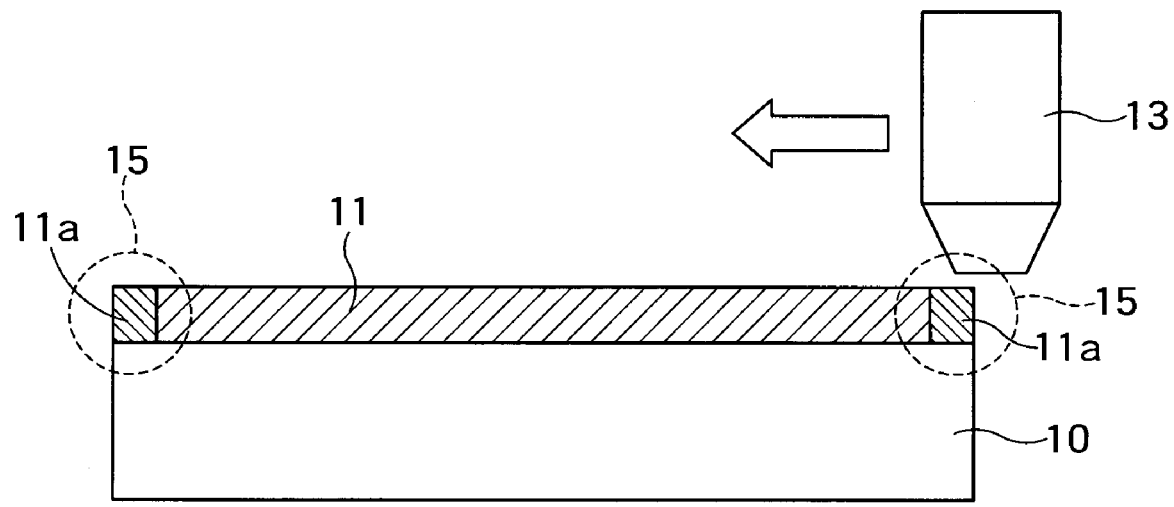
FIG. 1 is a sectional view showing the state of a resist film when wafer edge exposure is performed before immersion exposure.

The above phenomenon will be explained in more detail referring to FIG. 1. FIG. 1 is a sectional view showing the state of the resist film when the wafer edge exposure is performed before the immersion exposure. FIG. 1 schematically shows a cross section of one wafer. As shown in FIG. 1, the wafer edge exposure generates a wafer edge exposure region 11a on an edge 15 of an unexposed resist film 11 on a wafer 10. In this state, the immersion exposure is performed on the resist film 11 by scanning the surface of the resist film 11 and the wafer edge exposure region 11a with an immersion exposure nozzle 13. In this case, when the immersion exposure nozzle 13 passes over the wafer edge exposure region 11a, the immersion liquid provided between the immersion exposure nozzle 13 and the resist film 11 leaks through the wafer edge exposure region 11a.

The inventor uniquely discovered that the leakage of the liquid can be explained as follows. Specifically, the unexposed resist film 11 has a film quality that the immersion liquid does not remain on its surface when the unexposed resist film 11 is scanned by the immersion exposure nozzle 13. However, the film quality of the wafer edge exposure region 11a which went through the exposure is different from that of the unexposed resist film 11. Therefore, the immersion liquid remains on the surface of the wafer edge exposure region 11a after the immersion exposure nozzle 13 passes over the wafer edge exposure region 11a in the scanning operation. Therefore, the remaining liquid leaks outside the wafer 10.

A method that can be suggested to solve the above problem is to perform the wafer edge exposure after the immersion exposure and before the post exposure bake. However, the inventor noticed that this method causes a new problem since the time between the end of the immersion exposure and the start of the post exposure bake becomes long. In other words, the inventor discovered that this method causes a problem that a pattern dimension differs from a design value since the chemical reaction in the region of the resist film which went through the immersion exposure is differently activated, which is called post exposure delay (PED).

The inventor made the present invention based on the above unique discoveries.

Hereinafter, the embodiments of the present invention will be explained referring to the drawings. These embodiments do not limit the present invention.

Figure 2:
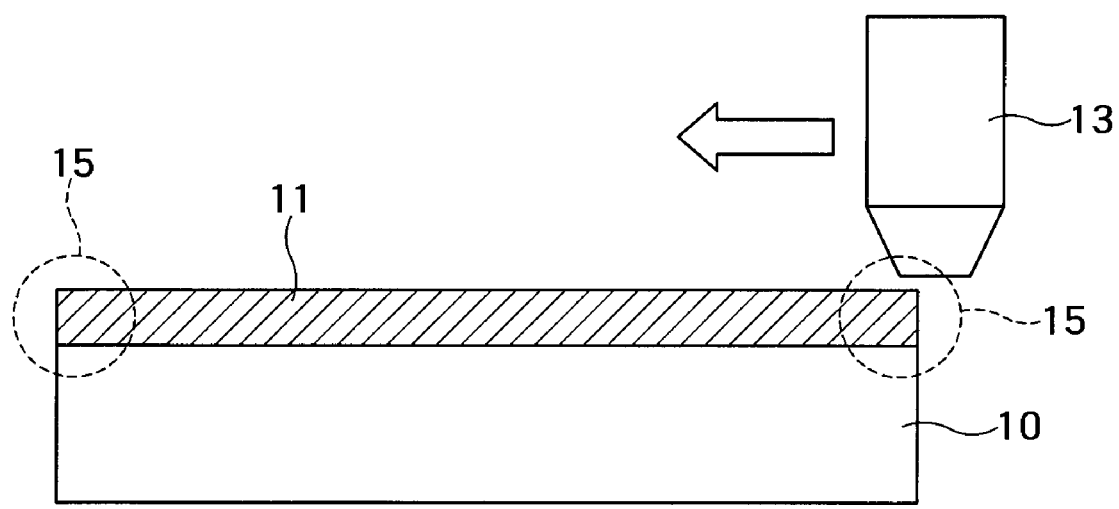
FIG. 2 is a sectional view showing the state of the resist film when the wafer edge exposure is not performed before the immersion exposure.

The following embodiments are based on the fundamental principle that the edge of the resist film is removed without performing the wafer edge exposure before the immersion exposure. Specifically, as shown in FIG. 2, the immersion exposure is performed in the state where the film quality of the edge 15 of the resist film 11 and that of the other regions of the resist film 11 are the same so that the liquid does not leak through the edge 15 during the immersion exposure.

Further, in the following embodiments, explanation will be made on an example in which the resist pattern is formed on an interlayer insulating film such as a silicon oxide film formed on a semiconductor substrate formed of silicon etc.

First Embodiment

A first embodiment of the present invention will be explained referring to FIGS. 3 to 5.

Figure 3:
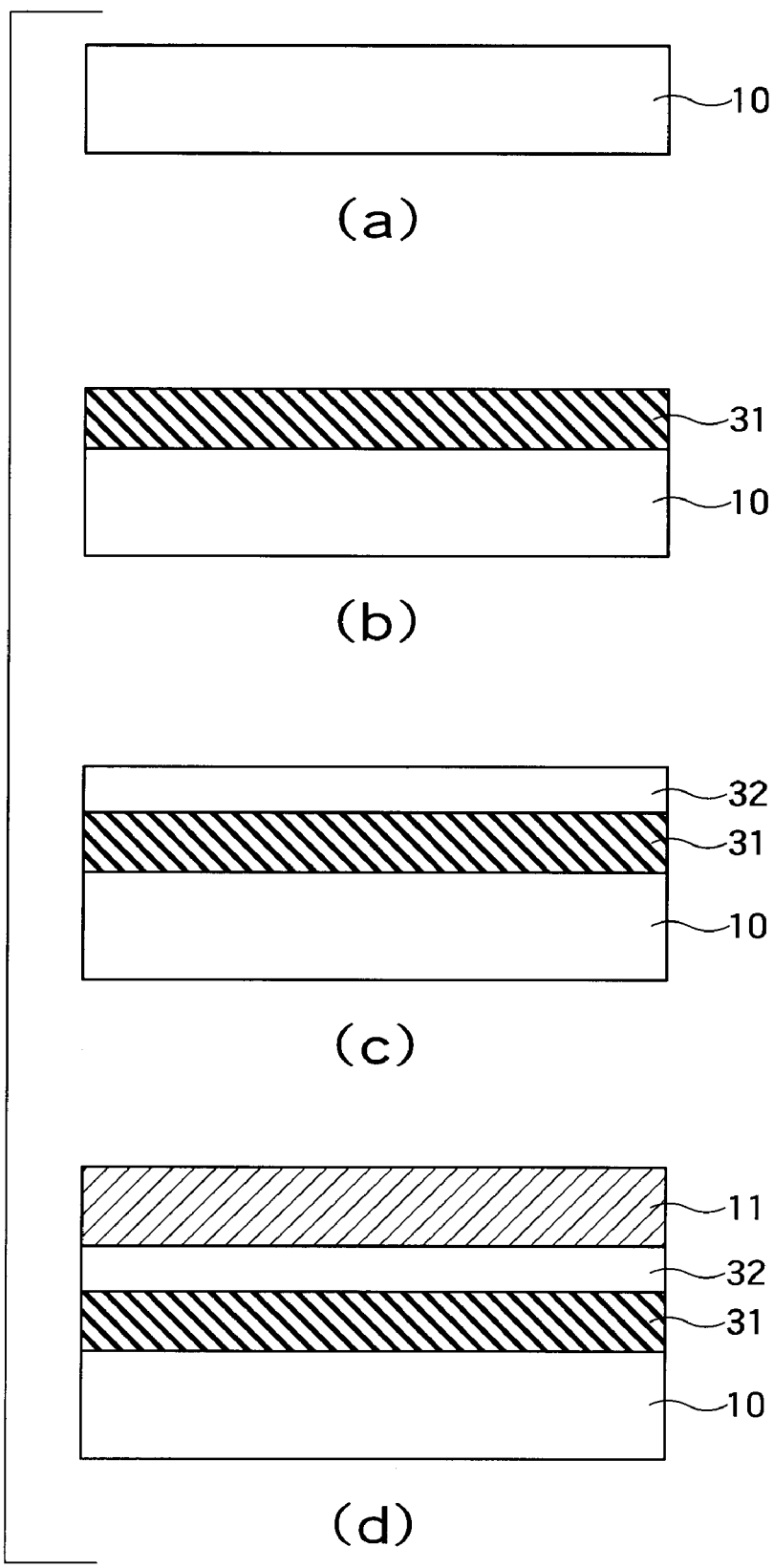
FIG. 3 is a sectional view to explain a method for manufacturing a semiconductor device according to a first embodiment of the present invention.
Figure 4:
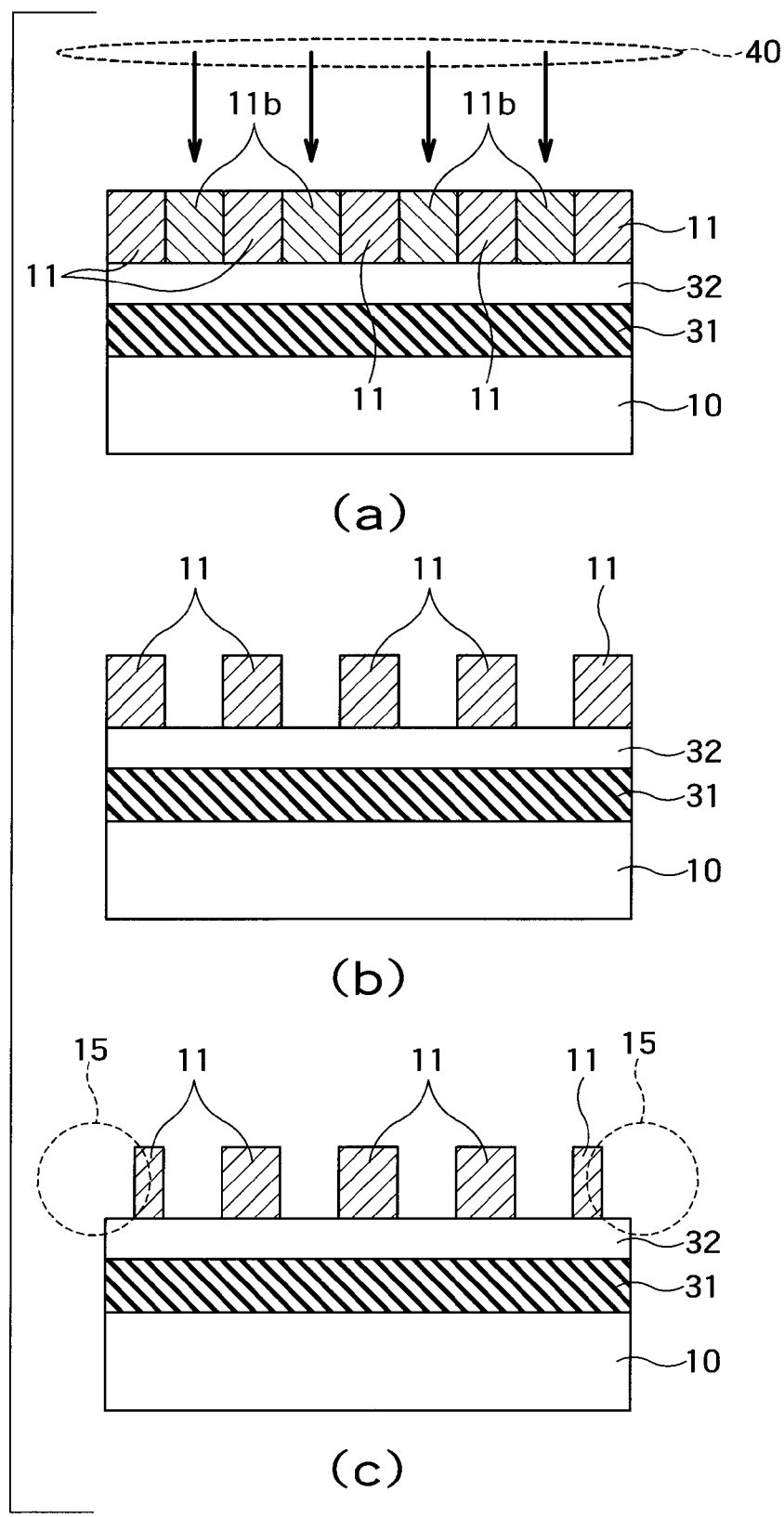
FIG. 4 is a sectional view to explain the method subsequent to FIG. 1 for manufacturing a semiconductor device.

Each of FIGS. 3 and 4 is a sectional view to explain a method for manufacturing a semiconductor device according to a first embodiment of the present invention. Note that each of FIGS. 3 and 4 schematically shows a cross section of one wafer.

[Process 1]

First, an organic lower film 31 having a predetermined film thickness is formed (FIG. 3(b)) on a wafer (silicon substrate) 10 (FIG. 3(a)) by spin coating. After that, baking process is performed. Next, a silicon-containing intermediate film 32 having a predetermined film thickness is formed (FIG. 3(c)) on the organic lower film 31 by the spin coating. After that, the baking process is performed.

[Process 2] Forming the Resist Film

Next, the resist film 11 is formed (FIG. 3(d)) by spin-coating an ArF positive type topcoatless resist material to have a predetermined film thickness.

[Process 3] Baking

Next, the baking process is performed at about 125° C. for about 60 seconds.

[Process 4] Immersion Exposure (Pattern Exposure)

Next, the immersion exposure is performed (FIG. 4(a)) by irradiating a predetermined region of the resist film 11 with an ArF excimer laser 40 by using an ArF excimer laser immersion exposure device. The immersion exposure is performed by scanning the surface of the wafer 10 with the immersion exposure nozzle (scanning exposure) while using a predetermined halftone mask. By performing the immersion exposure, an exposure region 11b having a pattern corresponding to the halftone mask is formed in the resist film 11.

[Process 5] Post Exposure Bake

Next, the baking process is performed at about 115° C. for about 60 seconds.

[Process 6] Development

Next, puddle development is performed for a predetermined time by using tetra methyl ammonium hydroxide (TMAH) aqueous solution having a predetermined density. By performing the puddle development, the exposure region 11b of the resist film 11 is removed and a pattern formed of the unexposed region is obtained (FIG. 4(b)).

[Process 7] Removing the Edge of the Resist Film (Edge Cutting)

After that, the unexposed edge 15 of the resist film 11 is removed by using thinner (organic solvent), for example (FIG. 4(c)). The width of the resist film to be removed is about 1 mm, for example.

Figure 5:
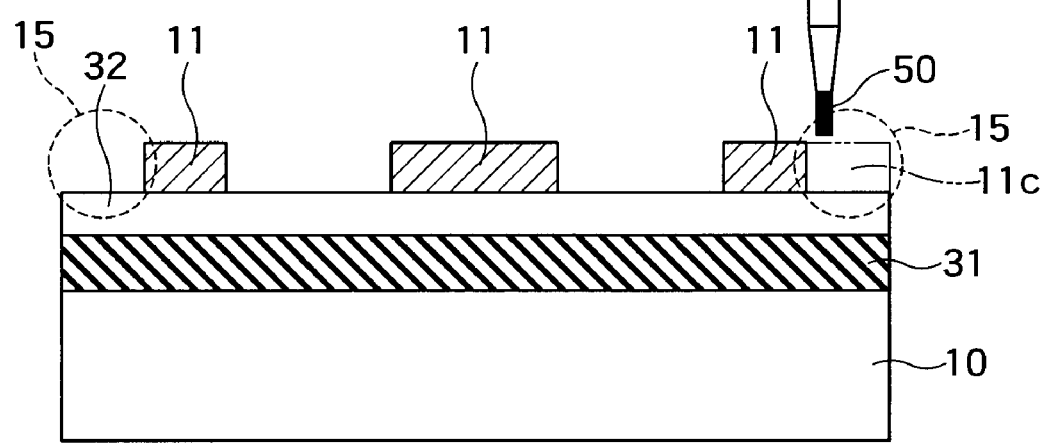
FIG. 5 is a sectional view showing the way to remove the resist film according to the first embodiment of the present invention.
Figure 5:
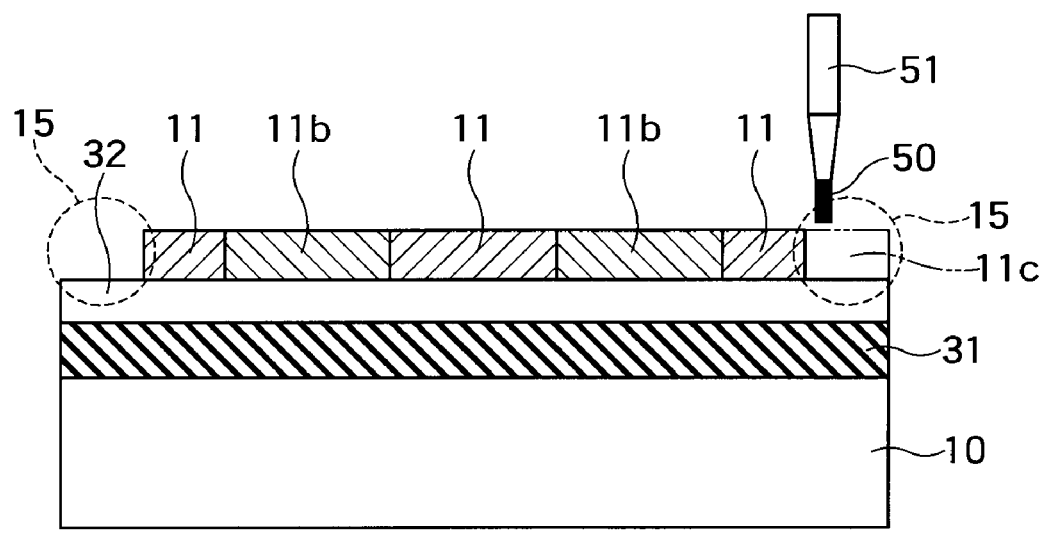

Here, the process 7 will be further explained referring to FIG. 5.

FIG. 5(a) is a sectional view showing the way to remove the edge of the resist film. As shown in FIG. 5(a), thinner 50 is discharged from a discharge device 51 to the edge 15 of the resist film 11 while rotating the wafer 10. In this way, the resist film 11c is coated with the thinner 50 to be removed through dissolution. In other words, the edge 15 of the resist film 11 is circularly removed along the outer circumference of the wafer 10.

With the above forming method, the resist pattern having a line-and-space (L/S) of about 45 nm, for example, can be formed.

Subsequent to the above processes, a series of processes including a process to perform the dry etching on the silicon-containing intermediate film 32 by using the resist pattern as a mask and a process to perform ion implantation are carried out to form the semiconductor device.

According to the first embodiment, the wafer edge exposure is not performed before the immersion exposure, by which the immersion exposure can be performed in the state where the film quality of the edge 15 of the resist film 11 and that of the other regions of the resist film 11 are the same. Therefore, the immersion liquid does not leak through the edge 15 of the resist film 11 during the immersion exposure. In addition, the edge 15 of the resist film 11 can be effectively removed.

Further, according to the first embodiment, it takes a short time to start the post exposure bake after the immersion exposure. Therefore, the post exposure delay is hardly caused.

A Modification Example of the First Embodiment

Next, a modification example of the first embodiment will be explained. The present modification example is different from the first embodiment in that the edge of the resist film is removed (Process 7) after the post exposure bake (Process 5) and before the development (Process 6). The other processes are the same as the first embodiment, and the explanation thereof will be omitted.

In the process 7, the edge 15 of the resist film 11 is removed similarly to the first embodiment. Specifically, as shown in FIG. 5(b), the thinner 50 is discharged from the discharge device 51 to the edge 15 of the resist film 11 while rotating the wafer 10. In this way, the resist film 11c is coated with the thinner 50 to be removed through dissolution. In other words, the edge 15 of the resist film 11 is circularly removed along the outer circumference of the wafer 10.

A similar effect to the first embodiment can be obtained also in the present modification example.

Note that the first embodiment and its modification example can be performed in parallel to optimize the productive efficiency of the semiconductor device in a factory etc. of the semiconductor device.

Second Embodiment

Next, a second embodiment of the present invention will be explained referring to FIGS. 6 to 8.

The present embodiment is different from the first embodiment in the following process. Specifically, the wafer edge exposure is performed after the post exposure bake (Process 5) and before the development (Process 6). Then, before the development (Process 6), the edge of the resist film is heated in parallel with or after the wafer edge exposure to have a temperature higher than ambient temperature. The process 7 is not performed. The other processes are the same as the first embodiment, and the explanation thereof will be omitted.

The process to perform the wafer edge exposure and to heat the edge of the resist film will be explained. This process is performed by using the substrate processing device shown in FIG. 6.

Figure 6:
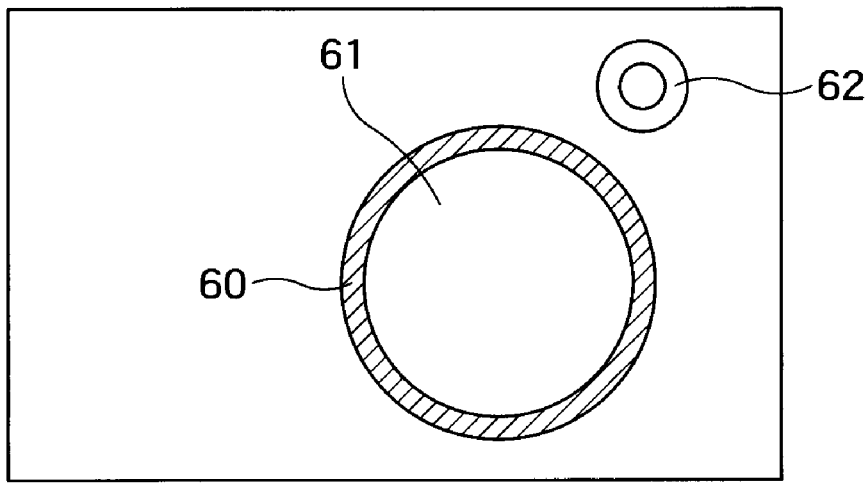
FIG. 6 is a schematic diagram showing the structure of the main part of a substrate processing device according to a second embodiment of the present invention.
Figure 6:
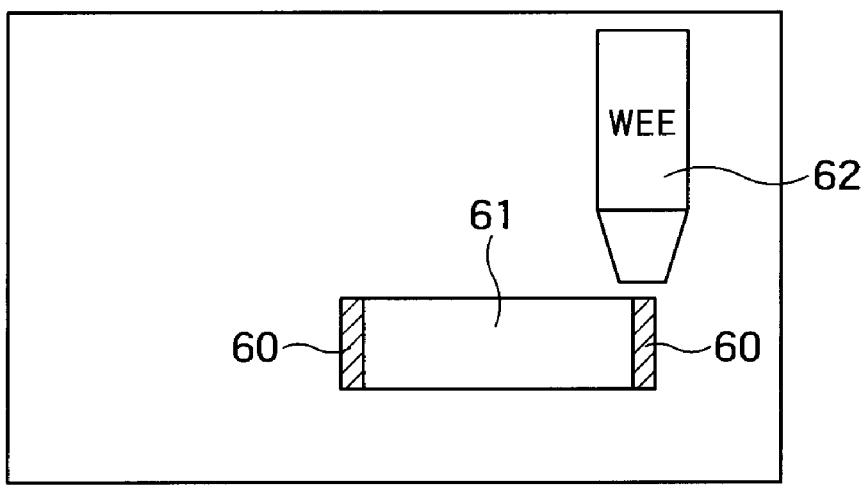

FIG. 6 is a schematic diagram showing the structure of the main part of the substrate processing device according to the second embodiment. FIG. 6(a) shows a top view, while FIG. 6(b) shows a side view. As shown in FIG. 6, the substrate processing device has a stage 61 (retainer) having a heater 60 (heating device) arranged on its periphery and the wafer edge exposure device 62. The stage 61 upwardly retains and rotates the wafer serving as a processing object. The heater 60 is arranged in the position where the edge of the resist film on the wafer can be heated. The wafer edge exposure device 62 is moved to perform the wafer edge exposure on the edge of the resist film.

Note that FIG. 6 shows only the components relating to the process to perform the wafer edge exposure and to heat the edge of the resist film. Further, the substrate processing device may be a coating/developing device or an exposure device.

Next, an example of the structure of the heater 60 will be explained.

Figure 7:
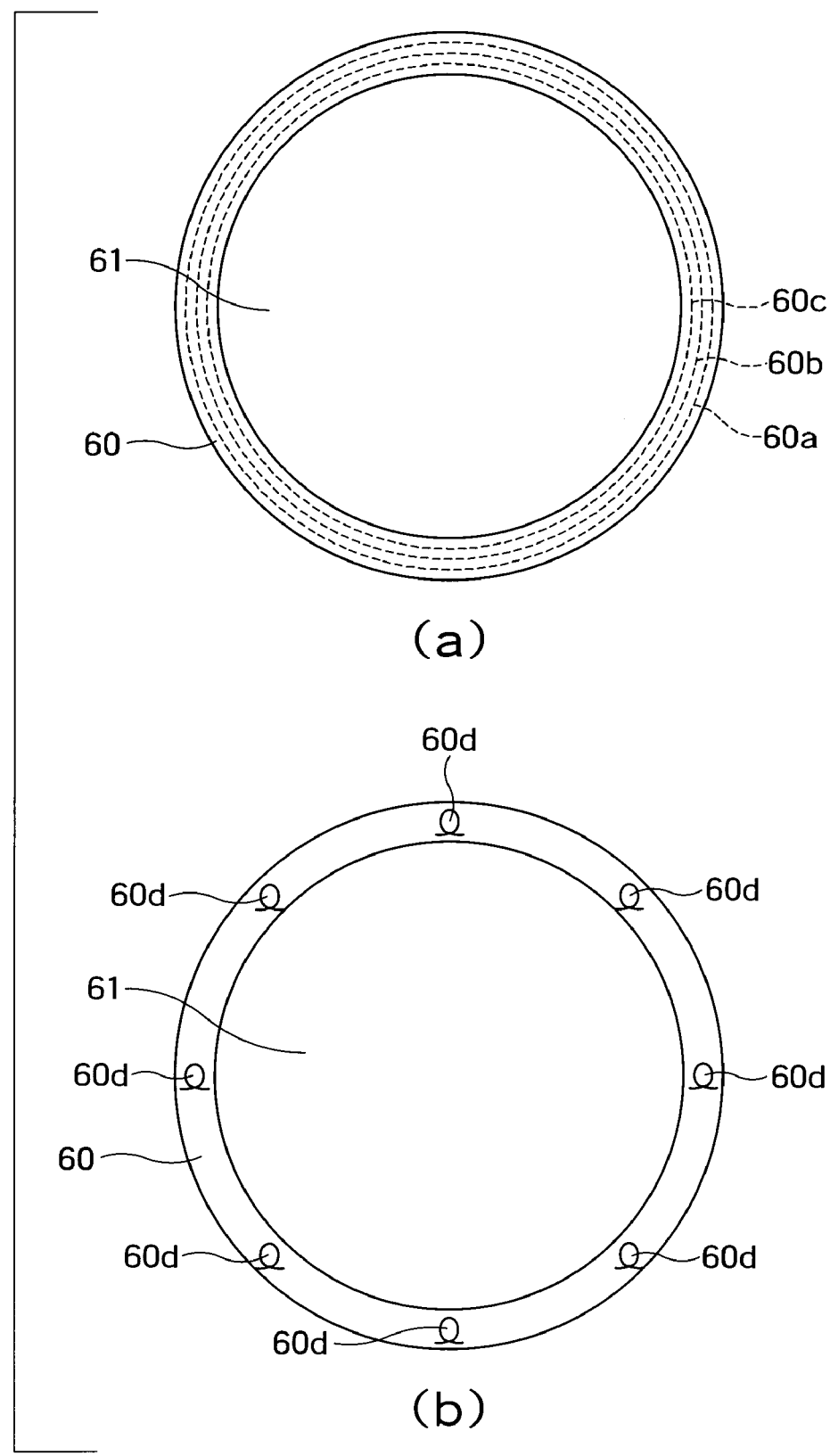
FIG. 7 is a schematic diagram showing the structure of a heater according to the second embodiment of the present invention.

FIG. 7 is a schematic diagram showing the structure of the heater 60 according to the second embodiment. The heater 60 shown in FIG. 7(a) has a plurality of circular hot wires 60a to 60c, which are concentrically arranged around the center of the wafer while having diameters different from each other. The diameters of the hot wires 60a to 60c are nearly the same as the diameter of the wafer. The heater 60 can heat only the edge of the resist film at a desired temperature by controlling the number and positions of the hot wires 60a to 60c to be energized. Further, in another example, the heater 60 shown in FIG. 7(b) has a plurality of small-sized hot wires 60d. The heater 60 can heat only the edge of the resist film at a desired temperature by controlling the number and positions of the hot wires 60d to be energized.

Figure 8:
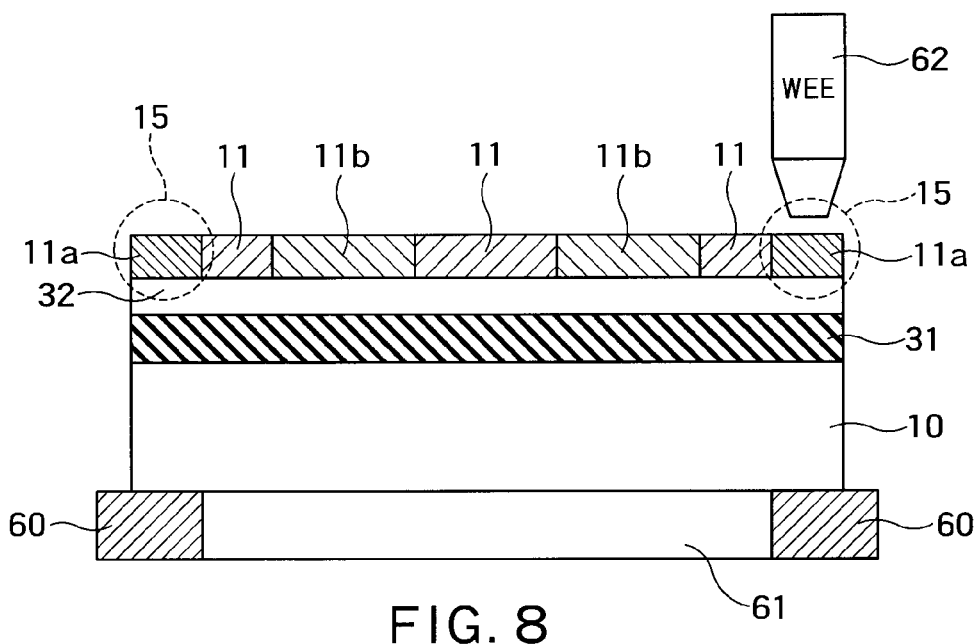
FIG. 8 is a sectional view showing the way to perform the wafer edge exposure and to heat the edge of the resist film by using the substrate processing device of FIG. 6 according to the second embodiment of the present invention.

FIG. 8 is a sectional view showing the way to perform the wafer edge exposure and to heat the edge of the resist film by using the substrate processing device of FIG. 6. As stated above, the wafer 10 is placed on the stage 61 and the heater 60. The other components are the same as FIG. 4 in the first embodiment and FIG. 6, and the explanation thereof will be omitted while assigning the same symbols to the same components.

In this process, the wafer edge exposure is firstly performed by moving the wafer edge exposure device 62 to irradiate the edge 15 of the resist film 11 with light. At this time, the wafer edge exposure is circularly performed on the edge 15 of the resist film 11 along the outer circumference of the wafer 10 while rotating the wafer 10 by using the stage 61. Then, the heater 60 is heated in parallel with or after the wafer edge exposure. In this way, only the edge 15 of the resist film 11 is heated (baked) to have a temperature higher than ambient temperature.

Here, the reason for heating the edge 15 of the resist film 11 will be explained. Once the post exposure bake is performed, the subsequent process to irradiate the unexposed edge 15 of the resist film 11 with light is not enough to activate the chemical reaction to the level at which the edge 15 can be sufficiently dissolved by a development liquid. Accordingly, in order to sufficiently activate the chemical reaction in the edge 15 of the resist film 11, the edge 15 of the resist film 11 is heated to have a temperature higher than ambient temperature in parallel with or after the wafer edge exposure. As a result, the edge 15 of the resist film 11 goes through the chemical reaction which is activated enough to make the edge 15 be sufficiently dissolved by the development liquid, by which the wafer edge exposure region 11a is formed. Next, in the development (Process 6), the exposure region 11b and the wafer edge exposure region 11a are removed.

According to the second embodiment, the wafer edge exposure is not performed before the immersion exposure, by which the immersion exposure can be performed in the state where the film quality of the edge 15 of the resist film 11 and that of the other regions of the resist film 11 are the same. Therefore, the immersion liquid does not leak through the edge 15 of the resist film 11 during the immersion exposure. In addition, the edge 15 of the resist film 11 can be effectively removed.

Further, according to the second embodiment, it takes a short time to start the post exposure bake after the immersion exposure. Therefore, the post exposure delay is hardly caused.

A Modification Example of the Second Embodiment

Next, a modification example of the second embodiment will be explained referring to FIGS. 9 and 10. The present modification example is different from the second embodiment in that the resist film on the periphery of the wafer is irradiated with infrared ray to have a temperature higher than ambient temperature. The other processes are the same as the second embodiment, and the explanation thereof will be omitted.

Hereinafter, explanation will be made on the process to perform the wafer edge exposure and to make the edge of the resist film have a temperature higher than ambient temperature. This process is performed by using the substrate processing device shown in FIG. 9.

Figure 9:
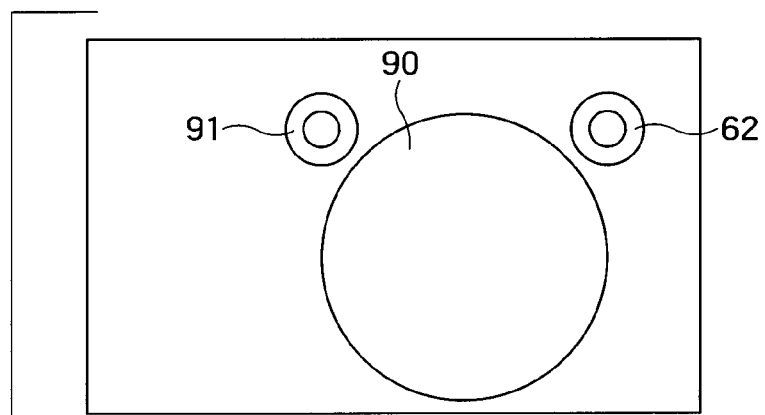
FIG. 9 is a schematic diagram showing the structure of the main part of the substrate processing device according to a modification example of the second embodiment of the present invention.
Figure 9:
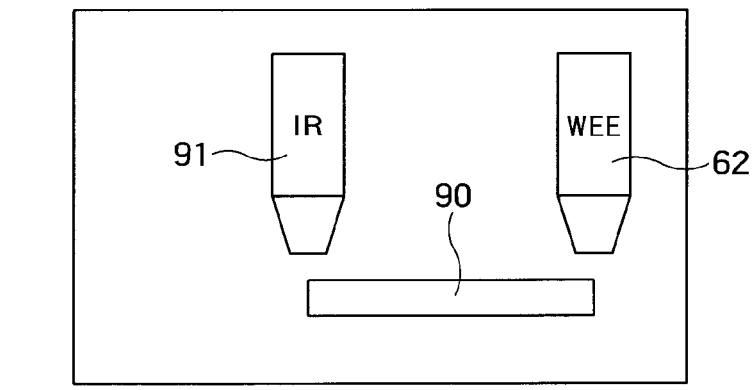

FIG. 9 is a schematic diagram showing the structure of the main part of the substrate processing device according to the second embodiment. FIG. 9(a) shows a top view, while FIG. 9(b) shows a side view. As shown in FIG. 9, the substrate processing device has a stage 90, an infrared irradiation device 91 (heating device), and the wafer edge exposure device 62. The stage 90 upwardly retains and rotates the wafer serving as a processing object. The infrared irradiation device 91 is moved to irradiate and heat the edge of the resist film on the wafer with the infrared ray. The wafer edge exposure device 62 is moved to perform the wafer edge exposure on the edge of the resist film.

Note that FIG. 9 shows only the components relating to the process to perform the wafer edge exposure and to heat the edge of the resist film. Further, the substrate processing device may be a coating/developing device or an exposure device.

Figure 10:
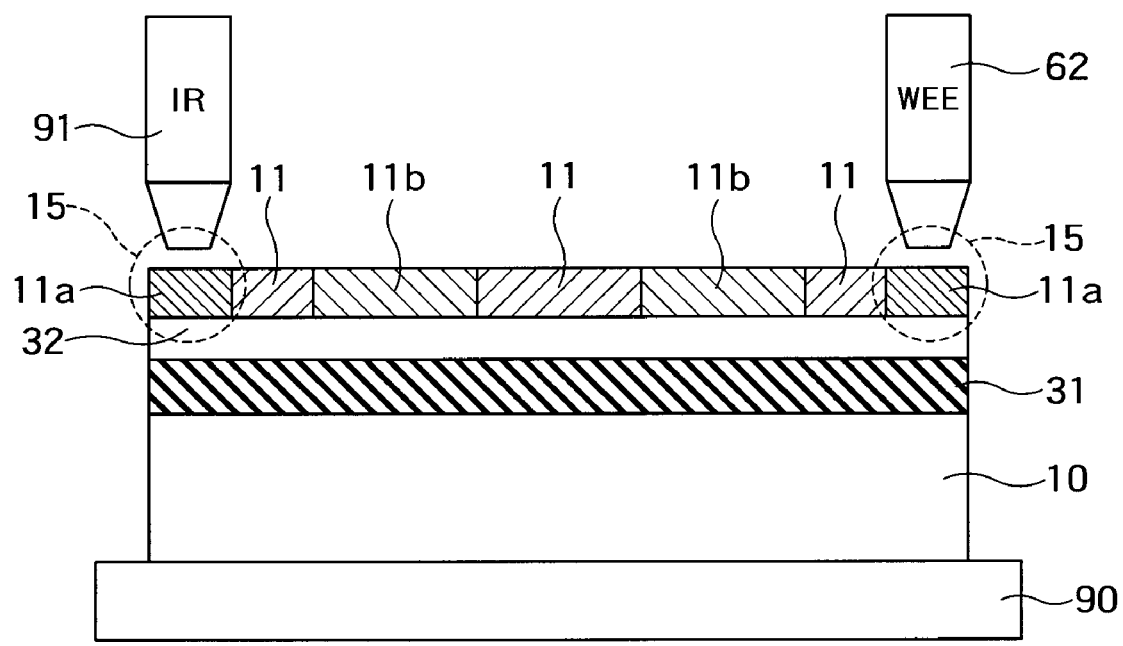
FIG. 10 is a sectional view showing the way to perform the wafer edge exposure and to heat the edge of the resist film by using the substrate processing device of FIG. 9 according to the modification example of the second embodiment of the present invention.

FIG. 10 is a sectional view showing the way to perform the wafer edge exposure and to heat the edge of the resist film by using the substrate processing device of FIG. 9. As stated above, the wafer 10 is placed on the stage 90. The other components are the same as FIG. 4 in the first embodiment and FIG. 9, and the explanation thereof will be omitted while assigning the same symbols to the same components.

In this process, the wafer edge exposure is firstly performed by moving the wafer edge exposure device 62 to irradiate the edge 15 of the resist film 11 with light. At this time, the wafer edge exposure is circularly performed on the edge 15 of the resist film 11 along the outer circumference of the wafer 10 while rotating the wafer 10 by using the stage 90. Then, the infrared irradiation device 91 is moved to irradiate the edge 15 of the resist film 11 with the infrared ray in parallel with or after the wafer edge exposure. In this way, only the edge 15 of the resist film 11 is heated to have a temperature higher than ambient temperature. The edge 15 of the resist film 11 is irradiated and heated with the infrared ray along the outer circumference of the wafer 10 while rotating the wafer 10 by using the stage 90.

According to the present modification example, the edge 15 of the resist film 11 is heated by the infrared ray to have a temperature higher than ambient temperature, by which a similar effect to the second embodiment can be obtained.

Note that, in the second embodiment and the modification example of the second embodiment, a cooling device can be used to cool the regions of the resist film except for the edge 15 of the resist film 11 at the time when heating the edge 15 of the resist film 11.

Third Embodiment

Next, a third embodiment of the present invention will be explained referring to FIG. 11.

The third embodiment is different from the first embodiment in the following process. Specifically, the resist film is cooled to go through the wafer edge exposure after the immersion exposure (Process 4) and before the post exposure bake (Process 5). The process 7 is not performed. The other processes are the same as the first embodiment, and the explanation thereof will be omitted.

The process to cool the resist film and to perform the wafer edge exposure will be explained. This process is performed by using a substrate processing device having the cooling device.

Figure 11:
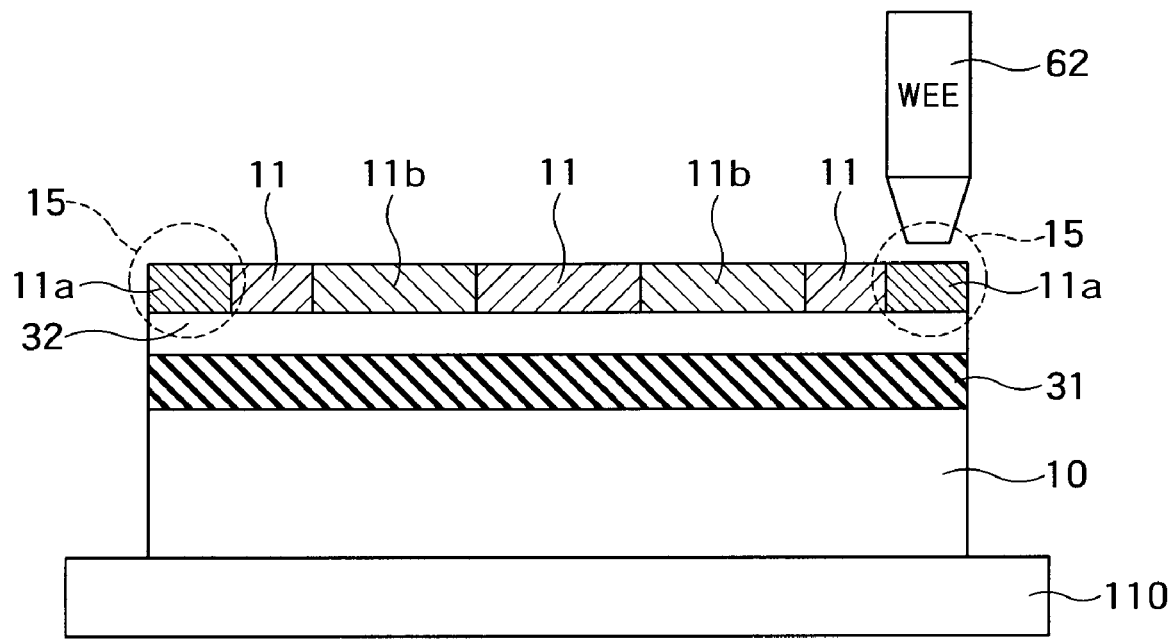
FIG. 11 is a sectional view showing the way to perform the wafer edge exposure and to cool the resist film by using the substrate processing device according to a third embodiment of the present invention.

FIG. 11 is a sectional view showing the way to perform the wafer edge exposure and to cool the resist film by using the substrate processing device. The wafer 10 is placed on a cooling device 110 doubling as a stage. The wafer edge exposure device 62 is moved to perform the wafer edge exposure on the edge 15 of the resist film 11. The other components are the same as FIG. 4 in the first embodiment, and the explanation thereof will be omitted while assigning the same symbols to the same components.

In this process, the exposure region 11b formed by the immersion exposure (Process 4) and the resist film 11 are cooled by using the cooling device 110 to have a temperature lower than ambient temperature. In this state, the wafer edge exposure is performed by moving the wafer edge exposure device 62 to irradiate the edge 15 of the resist film 11 with light. At this time, the wafer edge exposure is circularly performed on the edge 15 of the resist film 11 along the outer circumference of the wafer 10 while rotating the wafer 10 by using the stage 61. By performing the wafer edge exposure, the wafer edge exposure region 11a is formed. Note that the cooling process can be started at any time regardless of the timing of the wafer edge exposure, provided that the cooling process is performed after the immersion exposure (Process 4) and before the post exposure bake (Process 5). Note that the post exposure delay is hardly caused when the cooling process is started in a short time after the immersion exposure.

After the cooling process is ended, the subsequent processes starting from the post exposure bake (Process 5) are performed. Then, in the development (Process 6), the exposure region 11b and the wafer edge exposure region 11a are removed.

According to the third embodiment, the wafer edge exposure is not performed before the immersion exposure, by which the immersion exposure can be performed in the state where the film quality of the edge 15 of the resist film 11 and that of the other regions of the resist film 11 are the same. Therefore, the immersion liquid does not leak through the edge 15 of the resist film 11 during the immersion exposure. In addition, the edge 15 of the resist film 11 can be effectively removed.

Further, the resist film 11 and the exposure region 11*b* which went through the immersion exposure have a temperature lower than ambient temperature, by which the activation energy of acid generated in the exposure region 11*b* formed by the immersion exposure can be decreased. Therefore, the chemical reaction in the resist film 11 and the exposure region 11*b* is activated more slowly, and the post exposure delay is hardly caused.

Note that FIG. 11 shows only the components relating to the wafer edge exposure and the cooling process. Further, the substrate processing device having the cooling device may be a coating/developing device or an exposure device.

Although the embodiments of the present invention were explained in detail hereinbefore, a specific structure is not limited to the above embodiments. Other variations may be made within the scope which does not depart from the subject matter of the present invention.

For example, the resist pattern can be formed on an oxide film, a nitride film, a diffusion layer, a wiring layer, etc. formed on the silicon wafer.

The invention claimed is:

1. A method for manufacturing a semiconductor device comprising:
    forming a resist film on a film to be processed;
    baking the resist film;
    performing immersion exposure on the resist film after the baking;
    performing post exposure bake on the resist film after performing the immersion exposure;
    developing the resist film after performing the post exposure bake; and
    after the post exposure bake is performed on the resist film, removing an edge of the resist film, the edge not being exposed.

2. The method for manufacturing a semiconductor device according to claim 1, wherein the edge of the resist film is removed by coating the edge of the resist film with organic solvent.

3. The method for manufacturing a semiconductor device according to claim 2, wherein the edge of the resist film is coated with the organic solvent after the resist film is developed.

4. The method for manufacturing a semiconductor device according to claim 2, wherein the edge of the resist film is coated with the organic solvent before the resist film is developed.

5. The method for manufacturing a semiconductor device according to claim 2, wherein the edge of the resist film is coated with the organic solvent by discharging the organic solvent to the edge of the resist film while rotating a wafer on which the film to be processed and the resist film are formed.

6. The method for manufacturing a semiconductor device according to claim 2, wherein the organic solvent is thinner.

7. The method for manufacturing a semiconductor device according to claim 1, wherein the resist film is a topcoatless resist film.

* * * * *